United States Patent
Choi

(10) Patent No.: US 7,825,733 B2
(45) Date of Patent: Nov. 2, 2010

(54) CIRCUIT PROVIDING COMPENSATED POWER FOR SENSE AMPLIFIER AND DRIVING METHOD THEREOF

(75) Inventor: Jun Gi Choi, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 318 days.

(21) Appl. No.: 12/136,196

(22) Filed: Jun. 10, 2008

(65) Prior Publication Data

US 2009/0161463 A1 Jun. 25, 2009

(30) Foreign Application Priority Data

Dec. 20, 2007 (KR) ...................... 10-2007-0134036

(51) Int. Cl.
*H03L 7/099* (2006.01)
(52) U.S. Cl. .......................... 330/296; 330/297; 327/51; 327/54; 365/185.21; 365/189.011
(58) Field of Classification Search .................... 327/51, 327/52, 53, 54, 55, 56; 330/296, 297; 365/185.21, 365/189.011, 207, 210.12, 225.6
See application file for complete search history.

(56) References Cited

U.S. PATENT DOCUMENTS 7,002,872 B2 * 2/2006 Hwang et al. .......... 365/230.03
2002/0145928 A1 * 10/2002 Clark et al. ................. 365/207

FOREIGN PATENT DOCUMENTS

KR 1020040067192 A 7/2004
KR 1020070113813 A 11/2007

* cited by examiner

*Primary Examiner*—Kenneth A Parker
(74) *Attorney, Agent, or Firm*—Ladas & Parry LLP

(57) ABSTRACT

The present invention discloses a circuit providing a power for a sense amplifier that stabilizes a power voltage supplied to the sense amplifier by compensating a noise generated in the power voltage when the sense amplifier operates with an selectively generated decoupling noise. The circuit providing a power for a sense amplifier includes a sense amplifying circuit sensing and amplifying data loaded on a bit line with a first power. A power supplying unit provides the first power to the sense amplifying circuit. A decoupling unit generates a decoupling noise with a second power and provides the decoupling noise to the first power voltage. The decoupling noise is maintained for a period including a time point of an operation of the sense amplifying circuit and a predetermined time thereafter.

13 Claims, 4 Drawing Sheets

CIRCUIT PROVIDING COMPENSATED POWER FOR SENSE AMPLIFIER AND DRIVING METHOD THEREOF

CROSS-REFERENCE TO RELATED APPLICATIONS

The present application claims priority to Korean patent application number 10-2007-0134036 filed on Dec. 20, 2007, which is incorporated herein by reference in its entirety.

BACKGROUND OF THE INVENTION

The present invention relates to a semiconductor memory device, and more particularly to a circuit stabilizing a power voltage provided to the sense amplifier by compensating a noise generated in the power voltage when the sense amplifier operates with an arbitrarily generated decoupling noise.

In DRAMs, cell transistors are connected to word lines through the gates of the cell transistors. When a specific word line is turned on, a plurality of cell transistors operate. A charge charged in a storage node of the cell transistor is shared in bit lines according to the operation of the cell transistor. A sense amplifier is driven, and senses and amplifies the charge shared in the bit lines.

A conventional sense amplifier will be described with reference to FIG. 1.

If a pull-up driving control signal SAEP and a pull-down driving control signal SAEN are transited, or switched, to 'high', a pull-up driving transistor N10 and a pull-down driving transistor N12 are turned on.

A power voltage VDD and a ground voltage VSS are respectively applied to a pull-up driving terminal RTO and a pull-down driving terminal SB of a sense amplifier 10 when the pull-up driving transistor N10 and the pull-down driving transistor N12 are turned on. At this time, an equalization circuit 12 is not operated. For reference, the equalization circuit 12 includes a plurality of transistors which operate according to a bit line equalizing control signal BLEQ. The bit line equalizing control signal BLEQ maintains a disabled state when the sense amplifier 10 is driven.

The sense amplifier 10 senses and amplifies the voltage difference between the bit lines BL and BLb when the power voltage VDD and the ground voltage VSS are supplied to the pull-up driving terminal RTO and the pull-down driving terminal SB respectively.

In the sense amplifier 10, when the voltage at bit line BLb is less than the voltage at bit line BL by a predetermined difference $\Delta V$, the PMOS transistor MP1 within the sense amplifier 10 starts to be turned on as a voltage difference Vgs between a gate and a source with respect to the source, (i.e. with respect to the pull-up driving terminal RTO) is generated by $\Delta V$, thereby gradually raising the voltage level of the bit line BL having a bit line precharge voltage level.

When the voltage level of the bit line BL is increased, the PMOS transistor MP2 of the sense amplifier 10 starts to be turned off, and a NMOS transistor MN2 starts to be turned on as the voltage difference Vgs between a gate and a source with respect to the source, (i.e. with respect to the pull-down driving terminal SB) is generated by $\Delta V$, thereby gradually lowering a voltage level of the bit line BLb.

With such positive feedback manner, the PMOS transistor MP1 and a NMOS transistor MN2 are turned on and the PMOS transistor MP2 and a NMOS transistor MN1 are turned off.

Therefore, the sense amplifier 10 operates until the bit line BL reaches the level of the power voltage VDD applied to the pull-up driving terminal RTO, and until the bit line BLb reaches the level of the ground voltage VSS applied to the pull-down driving terminal SB.

Currents I1 and I2 are generated as the bit lines BL and BLb reach the power voltage VDD level or the ground voltage VSS level respectively. These currents flow directly between a power voltage VDD applying terminal and a ground voltage VSS applying terminal and have a maximum peak current value when the voltages applied to the bit lines BL and BLb are equal to VDD/2.

The current generated at this time is the largest peak current in an operation of a DRAM and is also the largest current consuming element.

As described above, when one word line is activated, a plurality of sense amplifiers 10 related thereto are operated. The bit lines BL and BLb are amplified according to the operation of the sense amplifiers 10, the power voltage VDD, and the ground voltage VSS level, or the ground voltage VSS and the power voltage VDD level according to the charge charged in the cell.

At this time, a current level determined according to the operation of the plurality of the sense amplifiers and relating to one word line flows between the power voltage VDD applying terminal and the ground voltage VSS applying terminal. Therefore, the power voltage VDD is temporarily reduced as shown in "A period" of FIG. 2, and the ground voltage VSS is temporarily bounced, or varied as is shown in FIG. 2.

A capacitor MC1 is provided between the power voltage VDD applying terminal and the ground voltage VSS applying terminal to prevent the temporary bouncing. As a result a noise on the power voltage VDD formed by a peak current can be reduced since the instantaneously needed charge is supplied from the capacitor MC1 when the sense amplifier 10 operates.

Meanwhile, a bank compress mode is used in DRAM test to shorten the test time. According to the bank compress mode failure of a cell is not inspected by performing an operation in the unit of one bank, but rather by operating a plurality of banks (for example, four banks) simultaneously. Therefore, in the bank compress mode, data of a plurality of banks are compressed and the compressed data is outputted to one data output port, thereby capable of shortening the test time to ¼ of the existing method.

However, since sense amplifiers of the plurality of banks operate simultaneously in this case, the reduction in the power voltage VDD is increased several fold and thus a row access strobe (RAS) to column access strobe (CAS) delay time tRCD is increased.

The power voltage VDD supplied in DDR2-DRAM is currently 1.8V, but the power voltage VDD supplied in DDR3 is 1.5V. According to this power consumption trend it is expected that the power voltage VDD supplied hereafter will be lowered to less than 1.2V.

As the power voltage VDD is reduced as described above, excessive drops in the power voltage VDD during the operation of the sense amplifier may result in deterioration of AC character and obstruction of device stabilization.

SUMMARY OF THE INVENTION

There is provided a circuit providing a power for a sense amplifier, which inhibits a noise generated by a peak current in a power voltage when a sense amplifier is driven, and a driving method thereof.

According to a first aspect of the present invention, there is provided a circuit providing a power for a sense amplifier, which includes a sense amplifying circuit sensing and amplifying data loaded on a bit line with a first power, a power supplying unit providing the first power to the sense amplifying circuit, and a decoupling unit generating a decoupling noise with a second power and providing the decoupling noise to the first power voltage. The decoupling noise is maintained for a period including a time point of an operation of the sense amplifying circuit and a predetermined time thereafter.

Preferably, the decoupling unit is driven by power voltage and ground voltage for a data output buffer as the second power voltage and ground voltage or driven by power voltage and ground voltage for a DLL circuit as the second power voltage and ground voltage.

Preferably, the decoupling unit includes a driving circuit driven by the second power voltage and ground voltage, and the driving circuit outputs an input signal that is transited to a high level for the period including the time point of the operation of the sense amplifying circuit and the predetermined time thereafter. The decoupling unit also includes a capacitor charging a voltage by the driving circuit and an output of the driving circuit, and providing the decoupling noise to the first power voltage of the power supplying unit in correspondence to the period in that the input signal is transited to the high level.

Preferably, the driving circuit includes a plurality of inverters that are serially connected with each other, driven by the second power voltage and ground voltage and drives the input signal to output to the capacitor.

Preferably, the driving circuit includes two stage inverters, and the capacitor is a NMOS transistor type capacitor of which gate is applied with the first power voltage of the power supplying unit and of which source, drain and well are connected to the output of the driving circuit.

According to a second aspect of the present invention, there is provided a driving method of a circuit providing a power for a sense amplifier, which includes generating a command controlling an operation of a sense amplifier, providing, synchronously with the command, an input signal that is transited to a high level for a period including a time point of an operation of the sense amplifying circuit and a predetermined time thereafter, and driving the input signal with power voltage and ground voltage having different use from power voltage and ground voltage used in the operation of the sense amplifier, and providing a decoupling noise to the power voltage used in the operation of the sense amplifier.

Preferably, the decoupling noise is driven by power voltage and ground voltage for a data output buffer or power voltage and ground voltage for a DLL circuit.

Preferably, the decoupling noise is generated by driving the input signal with the power voltage and ground voltage having different use from the power voltage and ground voltage used in the operation of the sense amplifier, and charging the driven input signal and applying it to the power voltage used in the operation of the sense amplifier.

According to the present invention described above, since the noise generated by a peak current on the power voltage is compensated by the decoupling noise generated when the sense amplifier is driven, generation of drop in the power voltage can be inhibited.

Therefore, a deterioration of RAS to CAS delay time tRCD in a DRAM driven with low power voltage and a deterioration of RAS to CAS delay time tRCD generated in the parallel test such as a bank compress mode can be compensated.

DESCRIPTION OF SPECIFIC EMBODIMENTS

Hereinafter, preferred embodiments of the present invention will be described in detail with reference to the accompanying drawings.

The present invention discloses a technology that generates a decoupling noise with a power being independent from a power voltage for operating a sense amplifier and compensates a noise formed on the power voltage applied for operating the sense amplifier.

Figure 1:
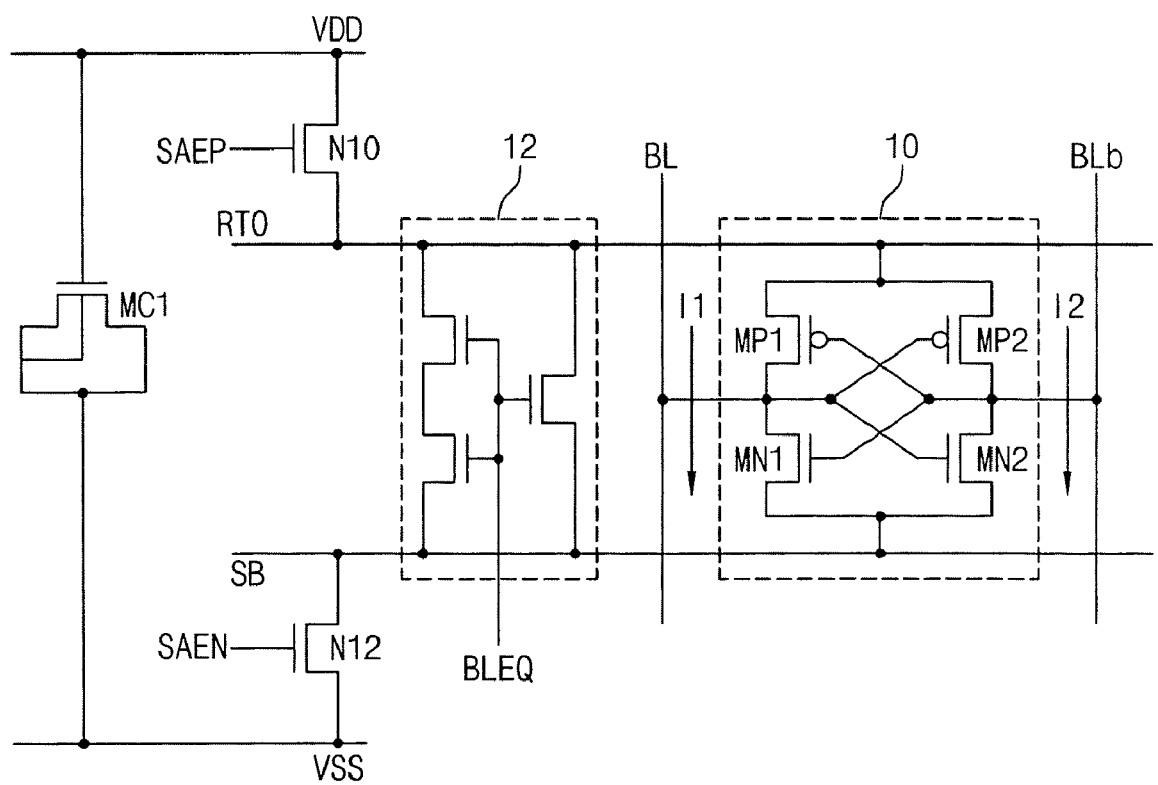
FIG. 1 is a circuit diagram showing a conventional sense amplifier circuit.
Figure 2:
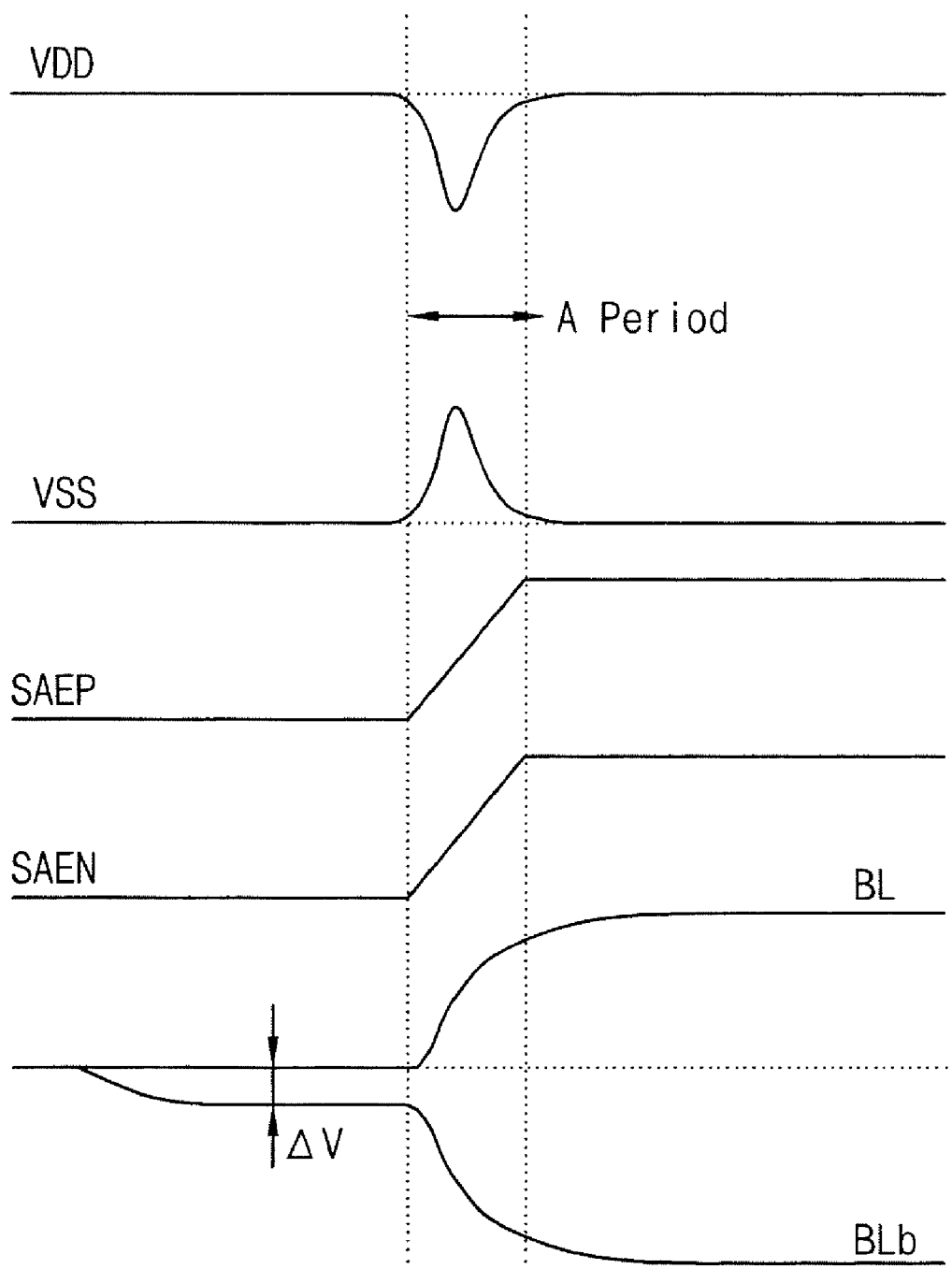
FIG. 2 is a waveform diagram of the sense amplifier circuit of FIG. 1.
Figure 3:
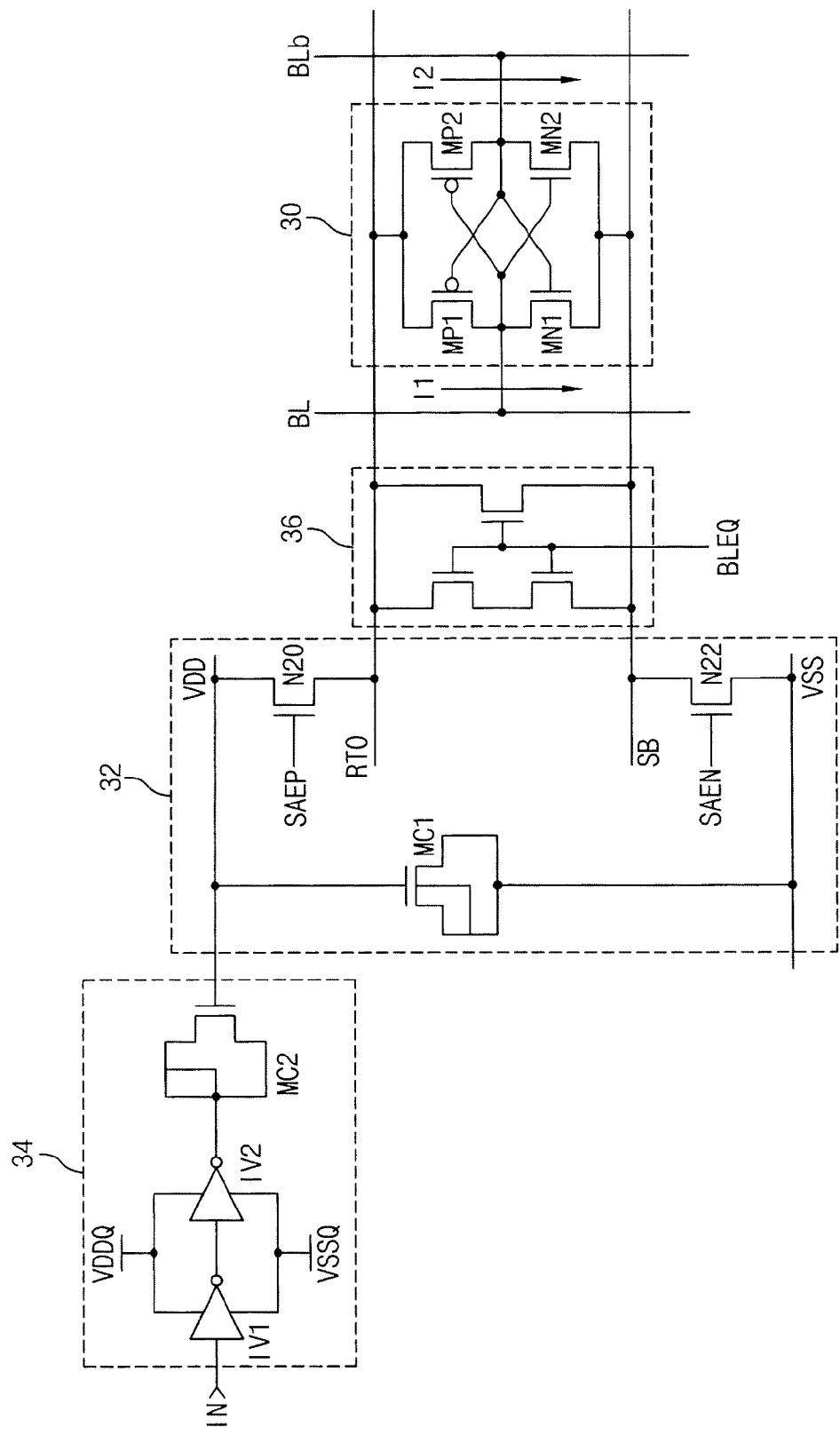
FIG. 3 is a circuit diagram showing a circuit providing operation voltage for a sense amplifier according to an embodiment of the present invention.

Referring to FIG. 3, the present invention includes a sense amplifying circuit 30, a power supplying unit 32, and a decoupling unit 34. The sense amplifying circuit 30 is connected with the power supplying unit 32 through an equalization unit 36.

More specifically, the sense amplifying circuit 30 includes pull-up driving PMOS transistors Mp1 and MP2 and pull-down driving NMOS transistors MN1 and MN2, which are disposed between a pull-up driving terminal RTO and a pull-down driving terminal SB. The pull-up driving PMOS transistor MP1 and the pull-down driving NMOS transistor MN1 are connected with each other through a common drain. Likewise, the pull-up driving PMOS transistor MP2 and the pull-down driving NMOS transistor MN2 are connected with each other through another common drain. The gate of the pull-up driving PMOS transistor MP1 and the gate of the pull-down driving NMOS transistor MN1 are coupled to the common drain of the pull-up driving PMOS transistor MP2 and the pull-down driving NMOS transistor MN2. The gate of the pull-up driving PMOS transistor MP2 and the gate of the pull-down driving NMOS transistor MN2 are coupled to the common drain of the pull-up driving PMOS transistor MP1 and the pull-down driving NMOS transistor MN1. In other words, the sense amplifying circuit 30 has a latch structure with cross-coupled internal transistors. The common drain between the pull-up driving PMOS transistor MP1 and the pull-down driving NMOS transistor MN1 is connected to a bit line BL, and the common drain between the pull-up driving PMOS transistor MP2 and the pull-down driving NMOS transistor MN2 is connected to a bit line BLb.

Also, an NMOS transistor N20, which is a pull-up voltage driving switching device, is disposed between the pull-up driving terminal RTO of the sense amplifying circuit 30 and the power voltage VDD applying terminal. An NMOS transistor N22, which is a pull-down voltage driving switching device, is disposed between the pull-down driving terminal SB of the sense amplifying circuit 30 and a ground voltage VBB applying terminal. An NMOS transistor type capacitor MC1 is disposed between the power voltage VDD applying terminal and the ground voltage VSS applying terminal. Herein, the NMOS transistor N20, the NMOS transistor N22, and the NMOS transistor type capacitor MC1 form the power supplying unit 32, which provides the power voltage VDD and the ground voltage VSS required for the operation of the sense amplifying circuit 30.

Further, an equalization circuit 36 is disposed between the sense amplifying circuit 30 and the NMOS transistors N20 and N22. The equalization circuit 36 is controlled by a bit line equalization signal BLEQ, and includes a plurality of transistors for switching the connection between the pull-up driving terminal RTO and the pull-down driving terminal SB.

Also, the decoupling unit 34 is disposed at the power voltage VDD applying terminal of the power supplying unit 32. The decoupling unit 34 includes a driving circuit having serially connected two stage inverters IV1 and IV2 driving an input signal, and a capacitor MC2 which charges a voltage by driven input signal and thus provides a decoupling noise compensating a noise formed at the power voltage VDD applying terminal.

The inverters IV1 and IV2, which form the driving circuit, are driven by a power that is independent from the power voltage VDD and the ground voltage VSS provided to the sense amplifying circuit 30. For example, in the present embodiment, a power voltage VDDQ and ground voltage VDDQ for a data output buffer are provided. An independent power which does not share the noise with the power supplied to the sense amplifying circuit, such as a power voltage VDDL and ground voltage VSSL for a DLL circuit, may be used as the power for the driving of the inverters IV1 and IV2.

The capacitor MC2 may be an NMOS transistor type capacitor. The gate of the capacitor MC2 is connected to the power voltage VDD applying terminal and a source, a drain, and a well of the capacitor MC2 are connected to an output terminal of the inverter IV2.

Figure 4:
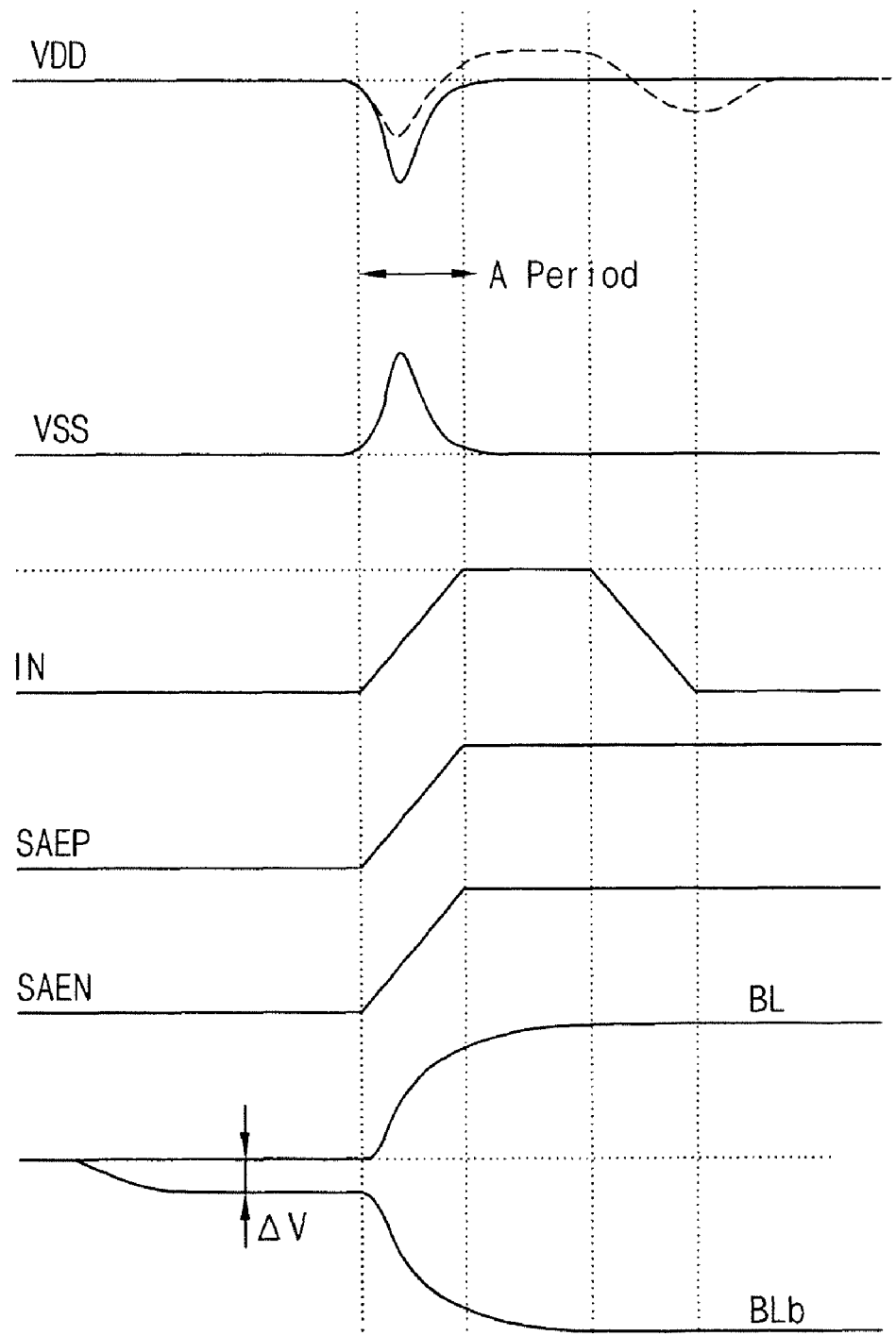
FIG. 4 is a waveform diagram showing an operation of the circuit providing operation voltage for a sense amplifier according to an embodiment of the present invention.

Herein with reference to FIG. 4, the input signal IN is shifted to a high level at the time point of the operation of the sense amplifying circuit 30, maintaining the high level for a predetermined time, and then shifted to a low level. The input signal IN may be maintained at the high level for a duration specified by a designer.

Herein, it is preferable that the input signal IN is shifted to the high level synchronously with the enablement time point of a pull-up driving control signal SAEP and a pull-down driving control signal SAEN, which provide the driving voltage to the sense amplifying circuit 30.

In other words, if the NMOS transistors N20 and N22 of the power supplying unit 32 are turned on while the pull-up driving control signal SAEP and a pull-down driving control signal SAEN are enabled (transited to the high level), the power voltage VDD supplied to the sense amplifying circuit 30 according to a peak current is reduced and the ground voltage VSS is bounced, or altered, for a predetermined period (A period). That is, a noise is formed.

The generation of noise is more severe when a large number of sense amplifiers are driven, for example, when confirming failure of a cell in a plurality of banks such as a bank compress mode.

According to the present invention the decoupling unit 34 provides a decoupling noise according to the input signal IN, compensating for the noise generated on the power voltage VDD (shown by dotted line in FIG. 4) while simultaneously driving the sense amplifying circuit 30.

In other words, the inverters IN1 and IV2 of the decoupling unit 34 are driven to supply a charge to the capacitor MC2 when the input signal IN is transited to the high level. The capacitor MC2 of the decoupling unit 34 supplies the charge to the power voltage applying terminal, thereby raising the level of the power voltage applying terminal.

As discussed above, the inverters IN1 and IV2 of the decoupling unit 34 are driven by a power independent from the power voltage VDD and the ground voltage VSS which drive the sense amplifying circuit 30. Therefore, the inverters IN1 and IV2 do not share the noise formed on the power voltage VDD.

In other words, the decoupling noise is generated by the independent power, which is used as a separate power in the package, and as such, the decoupling noise generated by the decoupling unit 34 provides compensation for the noise of the power voltage VDD applied to the sense amplifying circuit 30.

Summarizing the operation of the present invention, the pull-up driving control signal SAEP and the pull-down driving control signal SAEN are enabled according to a command which controls the operation of the sense amplifying circuit 30. The input signal IN is transited during the A period, including the time point of the operation of the sense amplifying circuit 30 and a predetermined time thereafter, and the input signal IN is provided to the decoupling unit 34 synchronously with the command.

Then, the noise formed on the power voltage VDD applied to the sense amplifying circuit 30 is compensated by the decoupling noise generated by the decoupling unit 34, which provides the decoupling noise to the power voltage VDD applying terminal.

As described above, according to the present invention it is possible to compensate for the drop in power voltage VDD which is generated when the sense amplifying circuit operates. It is also possible to prevent deterioration of a row-to-column delay time tRCD at a low power voltage VDD, and compensate for the deterioration of the row-to-column delay time tRCD generated in a parallel test.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A circuit providing a power for a sense amplifier, comprising:
   a sense amplifying circuit sensing and amplifying data loaded on a bit line with a first power voltage;
   a power supplying unit providing the first power voltage to the sense amplifying circuit; and
   a decoupling unit generating a decoupling noise having a second power voltage and providing the decoupling noise to the first power voltage,
   wherein the decoupling noise is maintained for a period including a time point of an operation of the sense amplifying circuit and a predetermined time thereafter.

2. The circuit providing a power for a sense amplifier as set forth in claim 1, wherein the decoupling unit provides the decoupling noise to the first power voltage from the time point of the operation of the sense amplifying circuit for the predetermined time.

3. The circuit providing a power for a sense amplifier as set forth in claim 1, wherein the decoupling unit is driven by the second power voltage, and the second power voltage comprises a power voltage and a ground voltage for a data output buffer.

4. The circuit providing a power for a sense amplifier as set forth in claim 1, wherein the decoupling unit is driven by the second power voltage, and the second power comprises a power voltage and a ground voltage for a DLL circuit.

5. The circuit providing a power for a sense amplifier as set forth in claim 1, wherein the decoupling unit comprises:
   a driving circuit driven by the second power voltage, and outputting an input signal that is transited to a high level for the period including the time point of the operation of the sense amplifying circuit and the predetermined time thereafter; and
   a capacitor charging according the driving circuit and an output of the driving circuit, and providing the decoupling noise to the first power voltage of the power supplying unit while the input signal is transited to the high level.

6. The circuit providing a power for a sense amplifier as set forth in claim 5, wherein the driving circuit comprises a plurality of serially connected inverters driven by the second power voltage, and the driving circuit drives the input signal to output to the capacitor.

7. The circuit providing a power for a sense amplifier as set forth in claim 6, wherein the driving circuit comprises two stage inverters.

8. The circuit providing a power for a sense amplifier as set forth in claim 5,
   wherein the capacitor is an NMOS transistor type capacitor,
   and wherein a gate of the NMOS capacitor is connected to the first power voltage of the power supplying unit, and a source, a drain, and a well of the NMOS capacitor are connected to the output of the driving circuit.

9. A driving method of a circuit providing a power for a sense amplifier, comprising the steps of:
   generating a command controlling an operation of the sense amplifier, the sense amplifier using a first power voltage and a first ground voltage;
   providing an input signal synchronously with the command, wherein the input signal is transited to a high level for a period including a time point of an operation of the sense amplifying circuit and a predetermined time thereafter; and
   driving the input signal with a second power voltage and a second ground voltage and providing a decoupling noise to the first power voltage used in the operation of the sense amplifier, wherein the second power voltage and the second ground voltage have different use from first power voltage and first ground voltage used in the operation of the sense amplifier.

10. The driving method of a circuit providing a power for a sense amplifier as set forth in claim 9, wherein the decoupling noise is driven by a second power voltage and a second ground voltage supplied for a data output buffer.

11. The driving method of a circuit providing a power for a sense amplifier as set forth in claim 9, wherein the decoupling noise is driven by a second power voltage and a second ground voltage supplied for a DLL circuit.

12. The driving method of a circuit providing a power for a sense amplifier as set forth in claim 9, wherein the generation of the decoupling noise comprises the steps of:
   driving the input signal with the second power voltage and the second ground voltage; and
   charging the driven input signal and applying the driven input signal to the first power voltage and the first ground voltage used in the operation of the sense amplifier.

13. The driving method of a circuit providing a power for a sense amplifier as set forth in claim 12, wherein the driving of the input signal is implemented by two stage inverting.

* * * * *